United States Patent [19]

Rodgers

[11] 4,222,063
[45] Sep. 9, 1980

[54] VMOS FLOATING GATE MEMORY WITH BREAKDOWN VOLTAGE LOWERING REGION

[75] Inventor: Thurman J. Rodgers, Palo, Calif.

[73] Assignee: American Microsystems, Santa Clara, Calif.

[21] Appl. No.: 910,789

[22] Filed: May 30, 1978

[51] Int. Cl.² ................. H01L 27/10; G11C 11/40
[52] U.S. Cl. ........................... 357/45; 357/23; 357/55; 357/59; 357/60; 357/89; 365/185
[58] Field of Search .............. 357/23, 45, 60, 59; 365/184, 185

[56] References Cited

U.S. PATENT DOCUMENTS

| 3,868,187 | 2/1975 | Masuoka ............... 357/23 |
| 4,016,588 | 4/1977 | Ohya et al. ............ 357/54 |

OTHER PUBLICATIONS

Rodgers et al., VMOS Memory Technology, IEEE Journal of Solid-State Circuits, vol. SC-12, No. 5, Oct. 1977, pp. 515-524.

Jenne' et al., "VMOS EPROM and Buried Source RAM Structures", *IEDM Late News Papers*, (Suppl. to *1976 IEDM Technical Digest*), pub. Dec. 5, 1976.

*Primary Examiner*—William D. Larkins
*Attorney, Agent, or Firm*—Owen, Wickersham & Erickson

[57] ABSTRACT

A semiconductor electrically programmable read only memory device (EPROM) utilizes an array of memory cells each in the form of a single V-type MOSFET which achieves the normal AND function (Data-Word Address) using a capacitance coupled version of threshold logic. Each MOSFET is formed by a V-shaped recess at the intersection of each bit line and word line that extends across the diffused bit line, (which serves as the transistor drain) and into the substrate (which serves as the source and ground plane of the device). A similarly V-shaped floating gate is isolated below and above the crossing bit and word lines by thin oxide layers. A ring of P-type conductive material around the upper end of each V-shaped recess and adjacent its surrounding N-type drain region serves to lower the required programming voltage without increasing the device threshold voltage.

2 Claims, 11 Drawing Figures

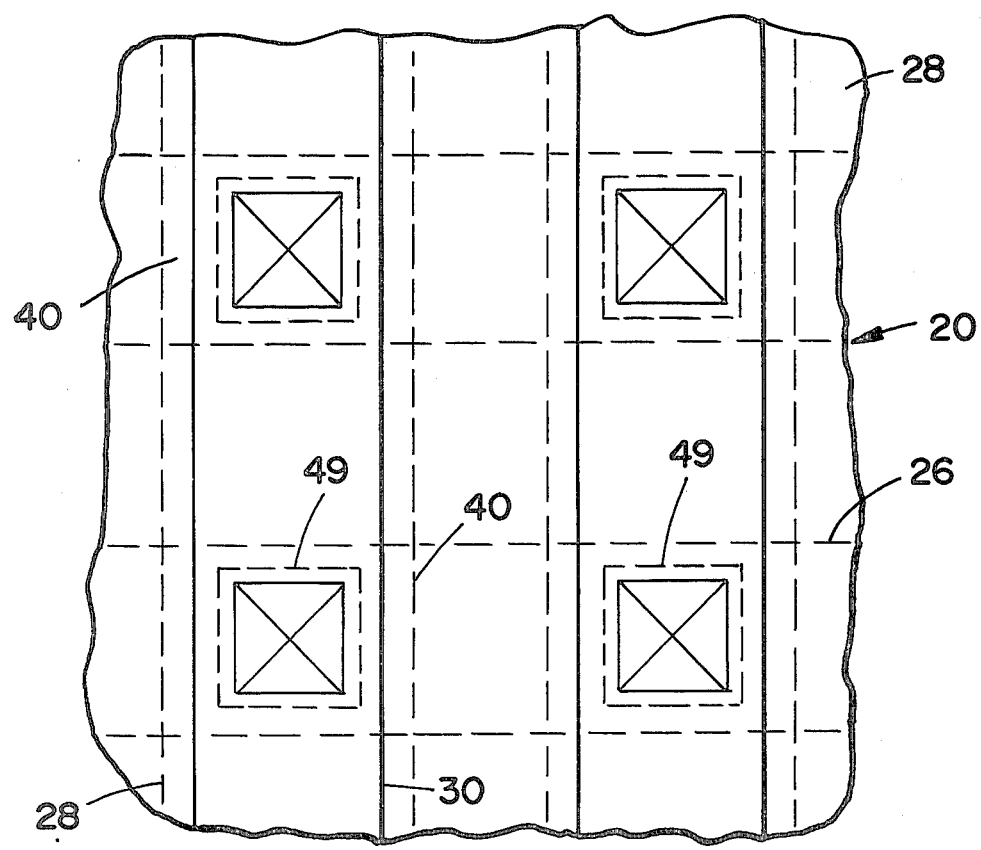
FIG_1
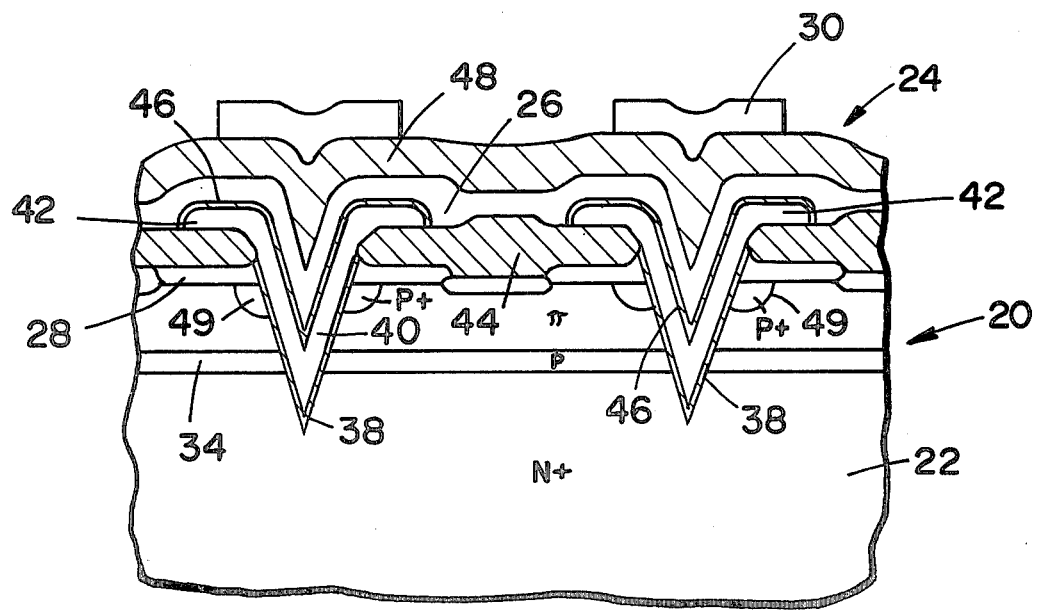
FIG_2

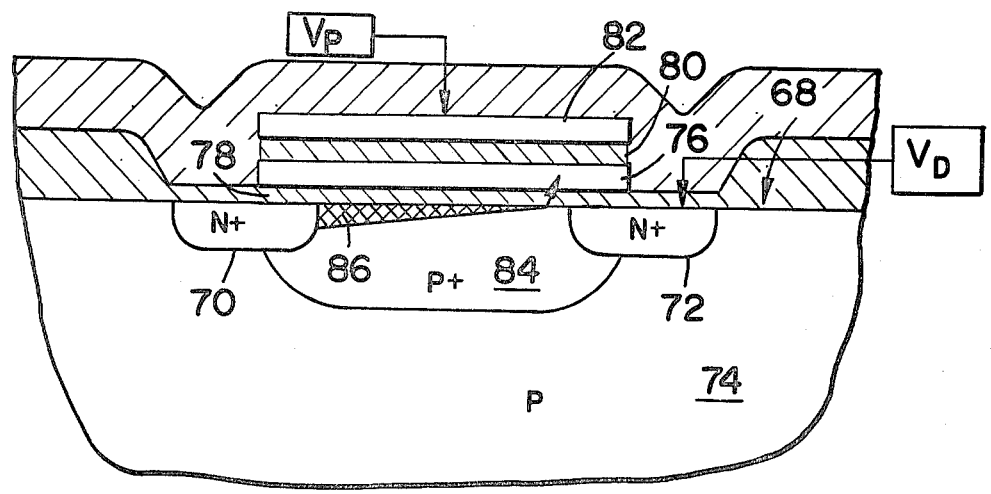
FIG_3
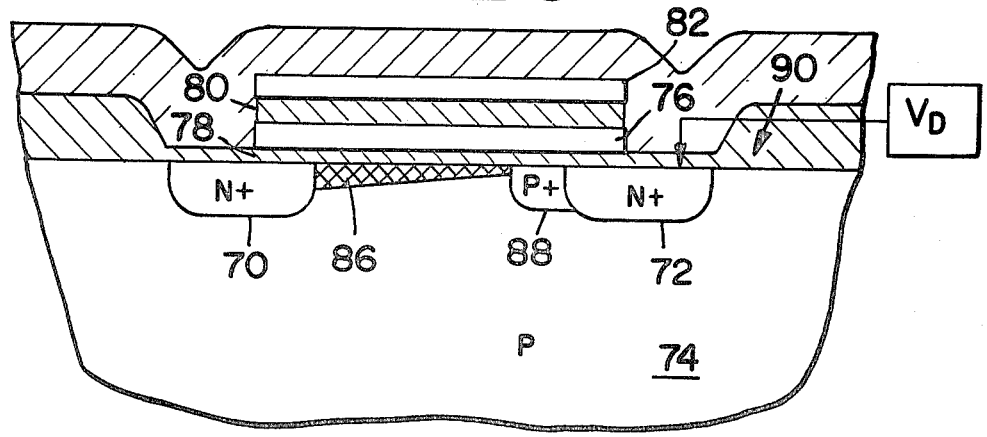
FIG_4
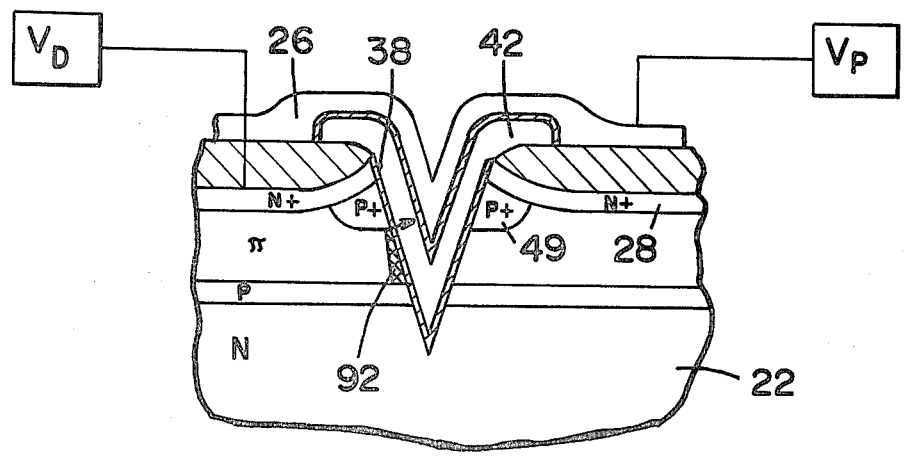
FIG_5

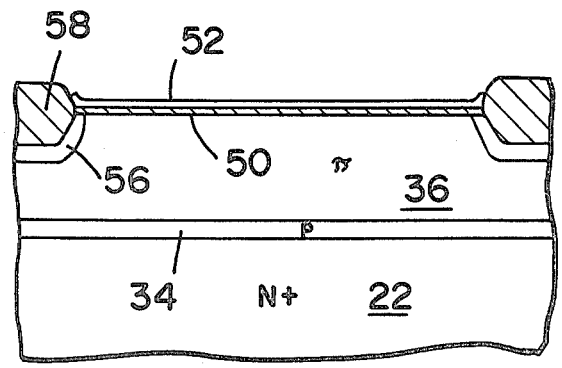
FIG_6
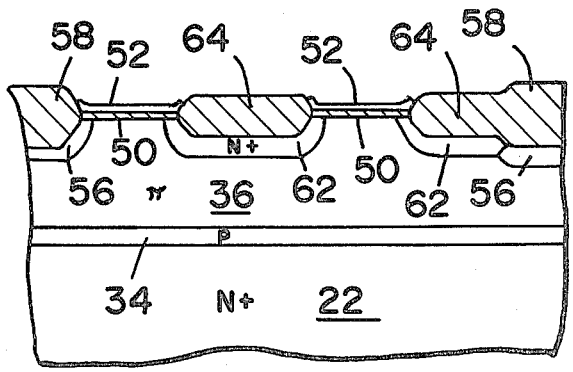
FIG_7
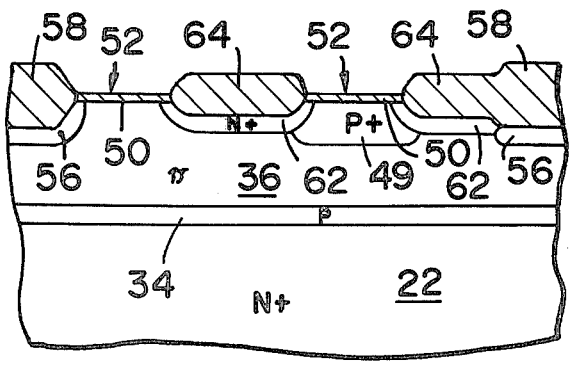
FIG_8
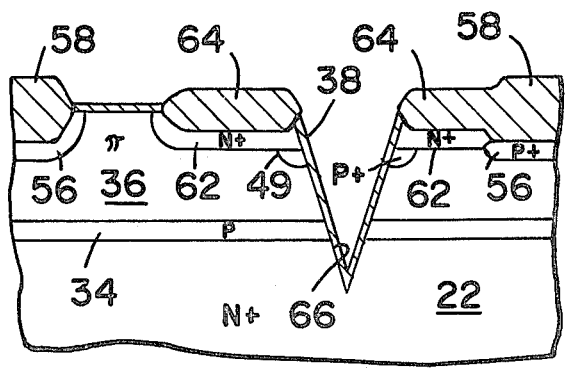
FIG_9
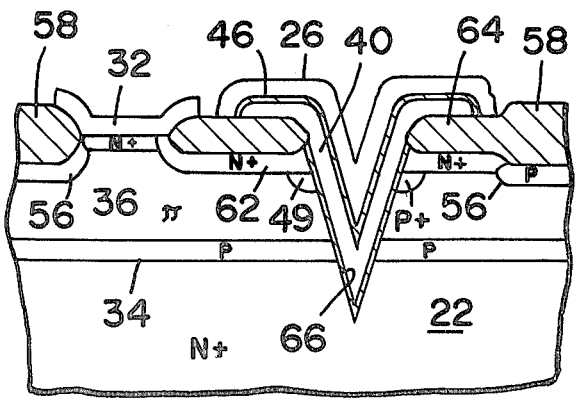
FIG_10
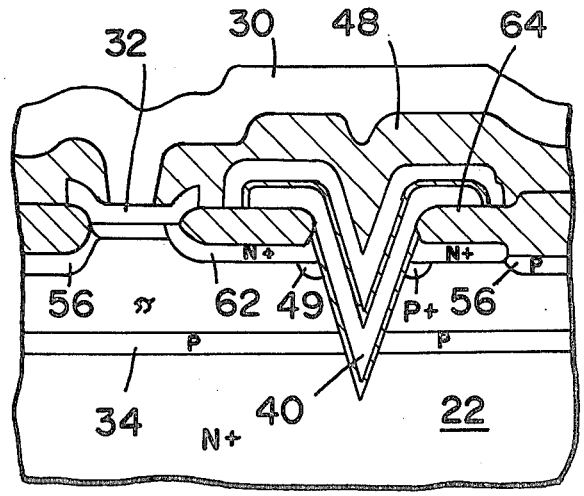
FIG_11

VMOS FLOATING GATE MEMORY WITH BREAKDOWN VOLTAGE LOWERING REGION

BACKGROUND OF THE INVENTION

This invention relates to an electrically programmable read only memory device (EPROM) and more particularly to an improved integrated circuit semiconductor EPROM comprised of an array of closely packed memory cells each utilizing a single transistor element. It also relates to a method for making such an improved device.

In the field of semiconductor memory devices electrically programmable read only memory devices (EPROM's) have been suggested which utilize electron injection using a so-called floating gate in combination with the gate of a metal oxide silicon field effect transistor (MOSFET). The memory cell was programmed by charge transport to the floating gate by injection of electrons from source-substrate or drain-substrate junctions or the conducting channel. Earlier devices previously designed utilized a planar type layout on the semiconductor chip wherein the floating gate region was located parallel to the device regions in the conventional manner. This arrangement required a substantial amount of chip area for each EPROM cell and hence a relatively large area for the entire device since such EPROM devices normally utilize a large number of cells. The excessive area problem of planar devices was greatly alleviated by the development of the VMOS type reprogrammable semiconductor memory device as described in co-pending application for U.S. Letters Patent, Ser. No. 683,185, filed May 4, 1976 and assigned to the assignee of this application. The V-MOS type EPROM, as previously disclosed, comprised an array of single V-type MOSFET memory cells formed at the crossover locations of word address lines and bit lines. Each MOSFET comprised a V-shaped recess that extended through a bit line of N-type conductivity material, through an epitaxial P layer and into a substrate of N type material providing a grounded source for the device.

Although the aforesaid V-MOS type EPROM provided a major advantage by reducing the area required per cell, it only partially solved a further and equally important problem with planar type EPROM devices, namely that of reducing the voltage required to accomplish programming of the device. With planar type devices the programmable voltage required was relatively high and often within 10% of the maximum device voltage allowable. Thus, an inadvertent application of only a relatively small excess voltage during programming could destroy the device. Attempts to lower the programming voltage are blocked by the fact that variations in doping levels and sizes of the device topology elements which were necessary to cause a reduction in programming voltage also inherently caused an increase in device threshold voltage, thereby making it either too slow or altogether inoperative. The V-MOS EPROM provided a partial solution to this problem by its mere geometry. However, it is one object of the present invention to provide an even more effective and efficient V-MOS EPROM device that allows a substantial reduction in required programming voltage and yet has a relatively low threshold voltage compared with prior EPROM devices.

SUMMARY OF THE INVENTION

The aforesaid and other objects are accomplished by a reprogrammable read only semiconductor memory device comprised of an array of single V-MOS transistor memory cells formed at the crossover locations of parallel and spaced apart word address lines and bit lines. The bit lines are diffused N-type regions within an epitaxial P layer on a substrate of N-type material which forms a common grounded source for the device. The P layer and N-type bit lines are covered by an insulation layer of oxide and the word address lines are formed of a suitable conductive material such as polycrystalline silicon on top of the oxide layer at right angles to the diffused bit lines. At each point on the device where a word line crosses over a bit line, a memory cell is formed within a recess that extends through the diffused N-type bit line and the epitaxial P layer and into the similar N-type substrate material. The recess has a "V" or inverse square pyramidal shape and is formed by an anisotropic etchant. The use of such etchants in the fabrication of so-called V-groove type semiconductor devices is disclosed in U.S. Pat. No. 3,924,265, which is assigned to the assignee of this application. Formed within the recess is a floating gate of polycrystalline silicon material which has the same V or pyramidal shape as the recess. This gate is separated on its bottom side from the N-type diffused bit line material by a thin layer of gate oxide. On its top side, the floating gate is separated from the conductive address line by a similar this insulative layer such as silicon oxide or a combination of silicon oxide and silicon nitride. In the aforesaid structure for each cell the N-type material near the floating gate becomes the drain of an active V-type MOSFET device and the N-type substrate material adjacent the lower tip of the floating gate becomes the source of the MOSFET device.

Surrounding the V or pyramidal shaped recess near its upper end and in contact with the N-type drain region is a ring or more heavily P doped material that serves to lower the voltage required to program the cell. The reason for this unusual combination of favorable effects is that with the V or pyramidal shaped recess, the P-doped material can be located directly adjacent the N-type drain region without being in the entire channel region between source and drain regions, as would be required in a planar, dual poly type geometry. If used in the entire channel region, the extra P-doping would cause a greatly increased threshold voltage. Thus, the use of only a small region of P-doped material in accordance with the present invention accomplishes the reduction of the required programming voltage without significant increase in threshold voltage.

The operation of an EPROM device embodying the principles of the invention is essentially the same as that of the V-MOS EPROM device described in the aforesaid application Ser. No. 683,185 except that the programming voltage required is considerably less.

Still another object of the present invention is to provide an effective and reliable method for fabricating a semiconductor EPROM device that is programmable by a relatively low voltage.

Other objects, advantages and features of the present invention shall become apparent from the following detailed description, presented with the accompanying drawing.

BRIEF DESCRIPTION OF THE DRAWING

FIG. 1 is an enlarged fragmentary plan view of the core portion of a memory device constructed in accordance with the invention;

FIG. 2 is a further enlarged view in cross section taken at line 2—2 of FIG. 1 and showing the internal construction of the memory core portion of the device;

FIG. 3 is a view in cross section of a conventional planar type floating gate device;

FIG. 4 is a view in cross section of a modified planar type floating gate device;

FIG. 5 is an enlarged view in cross section of a single V-MOS transistor memory cell with the path of hot electrons which program the device shown schematically;

FIGS. 6-11 are a series of views in cross section showing the method steps for making the device of FIGS. 1-3.

DETAILED DESCRIPTION OF PREFERRED EMBODIMENT

With reference to the drawing, FIG. 1 shows a greatly enlarged portion of the memory core of an electrically programmable-read-only-memory devide (EPROM) 20 according to the present invention, which is formed as an integrated circuit on a single chip or substrate 22 of semiconductor material. Although only a limited number of memory cells 24 are illustrated in FIG. 1, it is well known that a typical EPROM device may have many such cells arranged in an array on the chip at equally spaced apart intervals in addition to peripheral circuitry for encoding and decoding, etc. Each of the memory cells of the core is located within an area on the chip that is defined by the cross-over area of a word line 26 and a bit line 28. The word lines 26 are conductive paths formed at parallel, spaced apart intervals near the surface of the device and the bit lines 28 are elongated conductive regions that are oriented perpendicular to the word lines and are buried within the device. To provide lower impedance access to the buried bit lines for peripheral circuitry, surface bit lines 30 may be supplied which are connected at preselected locations by vertical conductive contacts (not shown). The actual width of all bit lines and word lines and the spacing between them may be readily selected in accordance with engineering design rules familiar to those skilled in the art. For example, the width of both bit and word lines may be around 8 microns or less, and the spacing between their centerlines may be around 14 microns or less, so that a relatively dense array of cells can be achieved in the memory core.

A pair of typical programmable memory cells 24 formed at the cross-over areas of a word and bit line in accordance with the present invention is shown in greater detail in the sectional view of FIG. 2. In the embodiment shown the substrate 22 is doubly-doped silicon material having a thickness of around 15 mils that has been doped with both P and N type dopants. For example, it may be N-doped with antimony in the range of $2 \times 10^{18}$ to $1 \times 10^{19}$ atoms per cubic cm, while also being counter doped with a P-type dopant such as boron in the range of $3 \times 10^{16}$ to $1 \times 10^{17}$ atoms per cubic cm. Extending across the substrate is a thin layer 34 of P conductivity material that forms the interfacing layer between the substrate 22 and the bottom surface of a thicker space charge layer or drift region 36. Diffused within the latter region are spaced apart buried bit lines 28 which are comprised of material having an N+ conductivity. Extending through each bit line 28, the P layer 34 and into the substrate 22 at spaced apart intervals along each bit line, are a series of recesses 37 each covered with a thin layer 38 of silicon dioxide which forms a gate oxide having a "V" shape in cross section. Actually, each recess and this latter thin layer is preferably V-shaped in two directions and therefore has an inverse pyramidal shape. A floating gate 40 having the same V-shaped cross section is formed on the upper surface of the V-shaped thin layer and it may have upper peripheral portions 42 that flare outwardly and essentially parallel to the lower P layer 34. This floating gate is formed from some suitable conductive material such as polycrystalline silicon. The upper flare-out gate portions 42 extend outwardly on each side with sufficient overlap to guarantee complete coverage of the thin insulating layer 38, and they are spaced above the buried bit line by an insulating layer 44 of silicon dioxide that is considerably thicker than the gate oxide layer 38. A thin insulating oxide layer 46 also extends over the floating gate 40 and conforms to its general shape. Thus, the gate 40 is surrounded by the thin layers 38 and 46.

As shown in FIG. 2, a word line 26 of conductive material such as polycrystalline silicon and having a uniform width extends over the thick oxide layer 44 and the thin oxide layer 46 covering each floating gate of each memory cell. A layer 48 of insulation material such as silicon dioxide formed by a chemical vapor deposition process (vapox) covers the spaced apart word lines.

Surrounding the V-shaped recess of each memory cell near its upper end is a ring 49 of P-type material such as boron with a doping concentration in the range of $4 \times 10^{16}$ to $1 \times 10^{18}$ atoms/cm$^3$. When formed of the proper material and properly located within the device body, the ring 49 preforms a unique and valuable function which enables the programming voltage for all cells of the memory device to be much lower than heretofore required for similar devices. The aforesaid doping concentration limits for the ring 49 is important, because going above the upper limit would result in raising the V-MOS threshold voltage ($V_T$) and lowering to next p the drain breakdown voltage during programming to below an acceptable level. Going below the minimum critical doping level in the P ring causes the VMOS EPROM device not to program unless the drain junction is avalanched. EPROM devices embodying the principles of the present invention are considered to have optimum operating characteristics when they are programmable with a gate voltage ($V_G$) of 15 volts and a drain voltage ($V_D$) of 8 volts.

As shown, the ring 49 is located just under and contiguous with the N-type drain region 28, and thus it is present in the sloped channel region between drain region and the common source 22. For reasons which are explained below, it is essential that the "P" ring occupy only the upper end of the sloped channel region between source and drain regions and that the P-ring should not cover more than approximately one-half of the channel area. The width and depth of this P-type ring is relatively small, (less than 1.0 micron) and it may be formed by ion implantation or diffusion procedures, as described below.

Functional advantages provided by the P-ring 49 may be best described by reference to FIGS. 3 to 5. FIG. 3 shows somewhat diagrammatically a planar type MOS device 68 wherein spaced apart source and drain regions 70 and 72 of N+ material are provided in the surface of an upper P layer 84 of the device. A floating gate 76, separated from the surface of the diffused regions by a thin oxide layer 78, also extends over these source and drain regions. Above the floating gate and separated from it by another thin oxide layer 80 is an operating gate 82 which may be part of a word line. Provided in the channel area between and overlapping the source and drain regions is an intermediate region 84 of P+ material. During programming, when a voltage $V_P$ is applied to the operating gate 82 and a voltage $V_D$ is applied to the drain 72, injection of hot electrons occurs in the channel region near the drain and, as indicated by the curved arrow, these electrons pass through the lower thin oxide layer near the drain region and into the floating gate 76 to charge it negatively. These hot electrons are produced by the high electric field in the drain region of the channel 86, which is represented by the wedge-shaped cross-hatched area and this electric field is enhanced by the heavy doping of P+ type material near the drain region.

However, when, as shown in the embodiment of FIG. 3, the P+ material 84 is present along the entire channel region, two detrimental effects occur. First, the presence of P+ material in the body of the transistor near the source region 70 causes a relatively high threshold voltage ($V_T$) which decreases device performance. Second, the junction formed by P+ material adjacent the N+ source and drain regions has relatively high capacitance characteristics which also reduces device performance, (e.g. speed capability), as well as lowering breakdown voltages which can affect the manufacturing yield of such a product.

With the planar MOS device it would be possible to overcome the aforesaid problems to some extent if the large P+ diffusion 84 in the entire channel region 86, as shown in FIG. 3, could be replaced by a very small P+ region 88 adjacent the drain region, as shown by the modified device 90 illustrated in FIG. 4. Such a small P+ region could be effective to cause hot electrons to move from the channel region through the thin oxide 78 into the floating gate 76. However, to be effective in controlling the threshold voltage, while lowering the programming voltage, the P+ region 88 would have to be extremely small relative to the channel width and it would also have to be located closely adjacent the drain region. With a planar type device, it would be difficult, using known diffusion or implantation techniques, to maintain the proper alignment and location of such a small P+ region. Thus, the maintenance of satisfactory yield rates in production would be difficult.

When embodied in the V-MOS single transistor memory cell 24 according to the present invention, the P-ring 49 produces the same advantageous functional effects and yet is in a form that can be manufactured in high production with precision. As shown in FIG. 5, the P-ring near the upper end of the V-shaped recess of each cell is directly under and adjacent to the surrounding N+ drain region 28. It is small in thickness and covers only an upper portion of the total length of sloped channel 92 (indicated as a cross-hatched wedge) between the drain 28, and the common source region 22. During programming of the device when a gate voltage $V_P$ of 15 volts is applied to a word line and a drain voltage $V_{DS}$ of 8 volts is applied to the drain, the high field created by the ring 49 of P+ material causes hot electrons (as indicated by the curved arrow) to acquire sufficient energy to pass through the lower oxide layer 38 into the floating gate 42, thereby charging the cell.

The operation of an EPROM device 20 having a multiplicity of single transistor cells 24 according to the present invention is accomplished using known procedures for similar devices as described in greater detail in the aforementioned U.S. application Ser. No. 683,185. In general, the substrate 22 of the device 20 serves as a common source or ground plane and the N+ diffused or buried bit lines 28 form the drain of the V-MOS transistor at each memory cell 24 in combination with its floating gate 42 which extends over the thin gate oxide layer 38 (having a capacitance $C_1$) into the substrate source. The floating gate serves to store a program charge and the conductive word line 26 couples through the capacitance ($C_2$) of the upper thin oxide layer 46. The bit lines are connected to suitable sense-amplifiers in the usual manner and to a fixed voltage potential ($V_{DD}$) through suitable biasing networks. Data is written into a cell when a potential is applied to a selected word line 26 while an associated bit line is biased to a lower potential. This causes hot electrons to be injected into the gate oxide near the drain junction of a cell 24 and attracted to the cell's floating gate 40 which has been charged positive by capacitance coupling from the word line. The electrons must be sufficiently energetic to overcome the potential barrier of the gate oxide 38 and this condition is enhanced by the P-ring 49, as previously described. Without a selection of the word line, i.e. when the word line remains at zero potential the floating gate of the cell remains near zero potential and therefore the device does not form channel 92 to inject charge onto gate 42 and therefore does not program. After injecting the negative charge on the floating gate, the word line is returned to near zero potential and the floating gate returns to some negative potential depending on the quantity of electrons that it has collected. The values of capacitor sizes $C_1$ and $C_2$) and potentials in a programable memory device embodying the invention may vary according to well known electrical and semiconductor principles. During the read cycle a voltage applied to the word line induces a voltage shift on the floating gate and if the gate was previously charged more negative than the value of the voltage shift, the transistor remains non-conductive and the output remains at $V_{DD}$. If the floating gate was not charged negative, the floating gate is coupled to a voltage which is sufficient to turn-on the transistor and conduct enough current to be detected by a sense amplifier.

During a reading operation a programmed and a non-programmed device can be distinguished as those assigned as arbitrarily a "zero" type and those assigned arbitrarily as a "one" type bit of computer information by reading them in the following manner. Assume, that during a "Word Select" operation, a standard reading voltage of 4.5 volts is applied to the gate of a zero or unwritten device. Based on the assumed capacitance ratio ($C_2 = 2C_1$) the voltage at the inner floating gate will be 3 volts. Since this is larger than the typical threshold voltage ($V_T$) of one volt for the VMOS transistor of the cell, the device will turn on. When this occurs, current will be drawn from an attached load resistor connected to a bit line and the output of the cell goes to a voltage called $V_{low}$, typically at least one volt lower than the bit line supply voltage. The load resistor is selected so that its impedance ratio with a device in the state given produces the designed output voltage.

When a programmed device is read, the reading voltage of 4.5 volts is again applied from the word line so that the gate again rises by 3 volts. However, since in a programmed or written device the floating gate is initially at −6 volts, its final voltage is a minus 3 (−3) volts. Since this latter voltage is less than the threshold voltage of the VMOS transistor of the cell, the transistor does not turn on, draws no current and does not lower the bit line potential. Thus, the output voltage from the cell is the same as the supply voltage $V_{DD}$, typically 5 volts which is evaluated by the sense amplifier as a "one" value.

Process Description

Fabrication of the semiconductor memory device 20 in accordance with the invention may be accomplished by a series of method steps substantially as described in the aforementioned U.S. application Ser. No. 683,185 but with additional steps in the proper sequence to provide for the formation of the P+ ring 49 on each memory cell.

The method, as illustrated in part in FIGS. 6–11, commences by first providing the silicon wafer 22 of <100> crystal orientation which has been doped with an N-type dopant such as antimony or arsenic. The wafer is then exposed to a P-type dopant such as boron in an ion implant machine or a predeposition type diffusion until a thin layer 34 at the surface of the silicon wafer is doped with the P-type dopant. This layer is typically 0.01 to 1.0 microns thick. The wafer is then placed in a high temperature diffusion tube whose temperature is in the range of 900° C. to 1,200° C. and the P-type dopant is diffused further into the silicon to a depth of 3 to 30 microns. The predeposition and diffusion cycles are tailored to produce a surface concentration of P-type dopant which is sufficient to create the desired threshold voltage on the active devices after all subsequent processing steps are finished.

After the P-type drive-in diffusion, the wafer is placed in an epitaxial silicon deposition system where the layer 36 of single crystal silicon typically 1.0 to 10.0 microns thick is grown on the wafer. This layer, designated by the symbol "Pi" ($\pi$) in the drawing, is of the same crystal orientation as the starting material 22 and is preferably lightly doped with P-type dopant typically in the range of $5.0 \times 10^{14}$ to $5.0 \times 10^{15}$ atoms/cm$^3$.

During the epitaxial silicon deposition process the P-type dopant in the substrate out-diffuses into the epitaxial layer to form the thin P layer 34. Actually, it is preferred that the N+ substrate 22 be heavily doped with antimony with some background P-doping with boron. Later, during heat treatments of the wafer, both the antimony and the boron out-diffuse into the Pi layer or region of the substrate. However, since the diffusion coefficient of boron is about ten times the diffusion coefficient of antimony for any temperature in silicon, the boron diffuses out farther during the same time and temperature treatment than does the antimony.

As shown in FIG. 6, after epitaxial depositions, the wafer is placed in an oxidizing atmosphere at a suitable temperature (e.g. around 1,000° C.) until the surface of the silicon wafer has oxidized to form an oxide layer 50 with a thickness in the range of 100 Å to 5000 Å. A silicon nitride film 52 is then deposited on the wafer to a thickness of 200 Å to 3000 Å.

A layer of photoresist (not shown) is then applied to the upper surface of the wafer and a predetermined pattern of active areas of the wafer is defined in the photoresist. The nitride and oxide layers are then removed from the inactive areas 54 of the wafer not covered by the photoresist. The wafer is then exposed in the inactive areas to a P-type dopant such as boron by an ion implant machine or a predeposition type diffusion until a P-type layer 56 is formed at the surface. This P-type layer is then diffused into the wafer in an oxidizing atmosphere below 1,200° C. which also grows a silicon dioxide layer or field oxide which is typically 5,000 Å–20,000 Å thick.

Now, the wafer is coated with another photoresist layer (not shown) and a predetermined pattern for resistors, surface gates, conductive layer contact and V-groove cells is defined in the photoresist. The nitride layer 52 and its underlying oxide layer 50 are removed from the wafer surface to form open areas 60 adjacent to the areas for the elements just listed. In these latter open areas, as shown in FIG. 7, the wafer is now exposed to an n-type dopant 62 such as phosphorus or arsenic by ion implantation or in a predeposition type diffusion at a temperature below 1,200° C. (for N+ drain regions). The wafer is then placed in another oxidizing atmosphere at a temperature below 1,200° C. and a silicon dioxide layer 64 several thousand angstroms thick is grown over the regions 62 exposed during the n-type diffusion. The remaining nitride 52 on the wafer is then removed in phosphoric acid at 150° C. without etching the underlying oxide layer.

The wafer is then coated with another layer of photoresist (not shown) and this photoresist is patterned such that only those areas are exposed where V-groove recesses are desired for memory cells. An oxide etchant is then used to remove the thin oxide in these areas. Now, as shown in FIG. 8, a P+ region 50 is formed, preferably by ion implantation of boron in a dose range of $5 \times 10^{12}$ to $1 \times 10^{14}$ carriers per square centimeter. This latter P+ region extends below and its outer edges overlap the N+ drain regions 62. Thereafter, as shown in FIG. 9, silicon is removed from these V-groove areas using an anisotropic etch which attacks silicon preferentially on different crystal planes. The amount of material removed is sufficient to create a V-shaped groove or recess 66 which penetrates through the P+ region 50 and the epitaxial layer 36 grown at the beginning of the process and into the substrate material 22. After each recess 66 has been formed, only a ring of P+ material remains near its upper end just under and adjacent to the N+ region 62. After formation of the recesses V-grooves 66, the wafer is placed in an oxidizing atmosphere at a suitable temperature and the silicon dioxide layer 38 is grown to form the gate dielectric for all the VMOS memory cells.

Now, referring to FIG. 10, a first polycrystalline silicon layer, typically less than 1 micron thick is deposited on the surface of the wafer and a photoresist masking and etching procedure is used to form the floating gates 40 within and over the V-shaped recesses 66 of the memory cells. Following this, the second thin oxide layer 46 is formed over the floating gates of the VMOS devices by placing the wafer in an oxidizing atmosphere at a temperature below 1,200° C. At this point another mask and etch procedure is used to remove the oxide layer in areas for surface contacts 32 normally required to connect surface bit lines with buried bit lines.

A second polycrystalline silicon layer 26 having approximately the same thickness as the floating gates is then applied to the wafer. After depositing this second polysilicon layer, the wafer is exposed to an N-type dopant in a predeposition type diffusion operation. A photoresist layer (not shown) is now applied and patterned so that it remains only over the areas where polysilicon is desired, and polysilicon is then removed from the exposed areas, to form the word lines 26 and the interconnecting contacts 32 for the bit lines.

Silicon dioxide doped with phosphorous oxide is then deposited on the surface of the wafer, as shown in FIG. 11, to form the insulating layer 48 to a thickness of several thousand angstroms. After this, photoresist is applied to the surface of the wafer again and is patterned to leave photoresist everywhere except where contacts to the polysilicon or silicon are desired. The deposited oxide of the layer 48 is then removed from the exposed areas and the wafer is heated to a temperature below 1,200° C. which causes the deposited glass to flow and smooth the edges of the contacts.

A metal such as aluminum or an aluminum-silicon alloy is then deposited on the surface of the wafer to a thickness of several thousand angstroms and the wafer is coated with photoresist. This photoresist layer is then patterned to leave photoresist wherever metallized areas are desired such as for the surface bit lines 30, and the exposed metal is removed. After the wafer is annealed in a neutral or reducing atmosphere at a temperature below 600° C., it is then complete unless a passivation and/or scratch protection layer of deposited silicon oxide or silicon nitride is desired.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A programmable read only memory device comprising:

a semiconductor substrate having an N-type conductivity;

an upper layer of P-type semiconductor material extending across said substrate;

a series of elongated, spaced apart N-type regions in said layer of semiconductor material forming bit lines;

a layer of insulating material on said bit line regions and said upper layer of semiconductor material;

a series of elongated, spaced apart conductive regions forming word lines on said layer of insulating material and oriented transversely to said bit lines;

a series of recesses spaced apart along each of said bit lines at locations where said word lines cross over said bit lines, each said recess extending through a said bit line and into said substrate and having a "V" shaped cross section;

a first thin dielectric layer within each said recess and covering the side walls of its said recess;

a layer of conductive material within each said recess on top of said thin dielectric layer therein and forming a floating gate having a "V" shaped cross section similar to said recess, each said gate extending downwardly from a drain region formed by a portion of a said bit line to a common N-type source region formed by said substrate;

a second thin dielectric layer between each said floating gate and a said word line directly above it; and a relatively narrow region of heavily doped P-type material in the wall of each said recess near its upper end adjacent to and just below the surrounding drain region of a bit line, and comprising a continuous ring of such material extending completely around the said "V" shaped recess, said narrow P-type region serving to increase the flow of hot electrons into said floating gate during the programming of said device without excessively increasing its threshold voltage.

2. The semiconductor device as described in claim 1 wherein the width of said narrow P-type region in a generally horizontal plane near the upper end of said region is less than one micron.

* * * * *

UNITED STATES PATENT AND TRADEMARK OFFICE
CERTIFICATE OF CORRECTION

PATENT NO. : 4,222,063
DATED : September 9, 1980
INVENTOR(S) : Thurman J. Rodgers It is certified that error appears in the above—identified patent and that said Letters Patent is hereby corrected as shown below:

Column 1, line 31, delete "the VMOS" and substitute --a VMOS--;

Column 2, line 32, delete "this" and substitute --thin--;

Column 2, line 41, delete "or" and substitute --of--;

Column 3, line 25, delete "devide" and substitute --device--;

Column 6, line 38, delete "$C_1$" and substitute --($C_1$--.

Signed and Sealed this

Third Day of February 1981

[SEAL]

Attest:

RENE D. TEGTMEYER

Attesting Officer — Acting Commissioner of Patents and Trademarks